(12) United States Patent
Toriumi

(10) Patent No.: US 9,389,636 B2
(45) Date of Patent: *Jul. 12, 2016

(54) CLOCK GENERATING DEVICE, ELECTRONIC APPARATUS, MOVING OBJECT, CLOCK GENERATING METHOD

(71) Applicant: Seiko Epson Corporation, Tokyo (JP)

(72) Inventor: Yuichi Toriumi, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/528,202

(22) Filed: Oct. 30, 2014

(65) Prior Publication Data

US 2015/0116015 A1    Apr. 30, 2015

(30) Foreign Application Priority Data

Oct. 31, 2013   (JP) .................................. 2013-227072

(51) Int. Cl.
     *H03K 3/011*      (2006.01)
     *G06F 1/10*      (2006.01)
     *H03L 1/02*      (2006.01)
     *H03L 7/08*      (2006.01)

(52) U.S. Cl.
     CPC .. *G06F 1/10* (2013.01); *H03L 1/02* (2013.01); *H03L 7/08* (2013.01)

(58) Field of Classification Search
     USPC ........ 327/90–91, 94, 291–292, 298; 341/119, 341/123–124
     See application file for complete search history.

(56) References Cited

U.S. PATENT DOCUMENTS 8,896,359 B1 * 11/2014 Ruffieux .................. G04G 3/04 327/262
8,975,970 B2 * 3/2015 Sonntag .................... H03L 7/00 327/155

FOREIGN PATENT DOCUMENTS

JP     2004-153332 A     5/2004
JP     2006-309479 A     11/2006

\* cited by examiner

*Primary Examiner* — An Luu
(74) *Attorney, Agent, or Firm* — Harness, Dickey & Pierce, P.L.C.

(57) ABSTRACT

A clock generating device measures a frequency ratio between a clock signal (32.768 kHz+α) and a reference frequency value based on a clock signal (25 MHz); generates a clock signal obtained by masking a portion of clocks of the clock signal based on a measurement result of the frequency ratio; and updates a compensation value of a frequency temperature characteristic of the clock signal when a difference between the measurement result of the frequency ratio and an average value of N (N is a natural number) measurement results is greater than a reference value of the frequency ratio.

9 Claims, 12 Drawing Sheets

| THE NUMBER OF CLOCKS 32.768 kHz + α (N/2) | MEASUREMENT TIME($T_{meas}$) [ms] | REFERENCE VALUE (F) | THE NUMBER OF COUNTS 25 MHz | THE NUMBER OF MASKS (K) | CORRECTION TIME ($T_{comp}$) [s] | CORRECTION PRECISION [ppm] |
|---|---|---|---|---|---|---|
| 64 | 1.7578125 | 48,828 | 43,945 | 4,883 | 1.34 | 20.48 |
| 128 | 3.515625 | 97,656 | 87,890 | 9,766 | 2.68 | 10.24 |
| 256 | 7.03125 | 195,312 | 175,781 | 19,531 | 5.36 | 5.12 |
| 512 | 14.0625 | 390,625 | 351,562 | 39,063 | 10.73 | 2.56 |
| 1024 | 28.125 | 781,250 | 703,124 | 78,126 | 21.46 | 1.28 |
| 2048 | 56.25 | 1,562,500 | 1,406,248 | 156,252 | 42.92 | 0.64 |

FIG. 4

$z(i)=(z(i-1)+L)$ mod G (L=481, G=390625)

CLOCK GENERATING DEVICE, ELECTRONIC APPARATUS, MOVING OBJECT, CLOCK GENERATING METHOD

BACKGROUND

1. Technical Field

The present invention relates to a clock generating device, an electronic apparatus, a moving object, and a clock generating method.

2. Related Art

JP-A-2006-309479 discloses a clock correction circuit that counts the number of pulses of a main clock included in one cycle of a sub clock output by a crystal oscillation circuit, uses the counted number of pulses and a predetermined reference number of pulses, and masks and outputs a portion of the main clock so that the number of pulses of the main clock included in one cycle of the sub clock is identical to the reference number of pulses.

In the clock correction circuit suggested in JP-A-2006-309479, it is preferable to compensate the sub clock in temperature since the frequency stability of the output clock deteriorates if the frequency of the sub clock changes. However, in a circumstance in which the temperature rapidly changes, the update cycle of the temperature compensation value is too long, and thus the frequency change of the sub clock caused by the temperature change is not sufficiently corrected and the frequency stability of the output clock deteriorates. On the contrary, in a circumstance in which the temperature slowly changes, the update cycle of the temperature compensation value is too short, and thus the electric current accompanied by the update of the temperature compensation value may be wastefully consumed.

SUMMARY

An advantage of some aspects of the invention is to provide a clock generating device that reduces wasteful electric power consumption and generates a clock signal having relatively high frequency stability, an electronic apparatus, a moving object, and a clock generating method.

The invention can be implemented as the following forms or application examples.

Application Example 1

This application example is directed to a clock generating device that measures a frequency ratio between a first clock signal and a reference frequency value based on a third clock signal; generates a second clock signal obtained by masking a portion of clocks of the first clock signal based on a measurement result of the frequency ratio; and controls a measurement interval of the frequency ratio based on a difference between the measurement result of the frequency ratio and an average value of N (N is a natural number) measurement results of the frequency ratio.

The clock generating device according to this application example encompasses the configuration in which the measurement interval of the frequency ratio is controlled based on the difference between a present measurement result of the frequency ratios and a previous measurement result of the frequency ratio, that is, in the case of N=1.

In the clock generating device according to this application example, the frequency change of the first clock signal becomes rapid as the difference between the measurement result of the frequency ratio between the first clock signal and the reference frequency value and the average value of N measurement results of the frequency ratio is greater, and becomes slow as the difference is smaller. Therefore, it is possible to generate the second clock signal with a relatively high frequency stability according to the frequency stability of the third clock signal and to reduce electric power consumed by an unnecessary frequency ratio measurement, by appropriately controlling the frequency ratio measurement interval based on the difference.

In the clock generating device according to this application example, it is possible to generate a second clock signal of a desired frequency (desired average frequency) by omitting or simplifying a frequency changing mechanism (temperature compensation circuit or the like) of the first clock signal by masking a portion of clocks of the first clock signal.

Application Example 2

The clock generating device according to the application example described above may include a clock gate unit that generates the second clock signal; a frequency measuring unit that measures the frequency ratio; an oscillating circuit that outputs the third clock signal; an average value output unit that outputs the average value; a comparison unit that compares a measurement result of the frequency ratio and the average value, and outputs a value corresponding to the difference; and a detection unit that compares the number of clocks of the second clock signal and an output value of the comparison unit and controls a measurement interval of the frequency ratio based on a comparison result.

According to this application example, it is possible to realize a clock generating device that can generate the second clock signal with a relatively high frequency stability and to reduce unnecessary electric power consumption by a relatively simple configuration.

Application Example 3

In the clock generating device according to the application example described above, the comparison unit may output a greater value when the difference is within a reference value than when the difference is greater than a reference value.

In the clock generating device according to this application example, it is possible to cause the measurement interval of the frequency ratio to be longer when the difference between the measurement result of the frequency ratio and the average value of N measurement results of the frequency ratio is within the reference value (when the frequency change of the first clock signal is relatively low), than when the difference is greater than the reference value (when the frequency change of the first clock signal is relatively rapid). Accordingly, it is possible to generate the second clock signal with the relatively high frequency stability and to reduce the electric power consumed by the unnecessary frequency ratio measurement.

Application Example 4

In the clock generating device according to the application example described above, the average value may be a movement average value of N measurement results of the frequency ratios.

In the clock generating device according to this application example, the frequency change of the first clock signal is more securely detected based on the difference between the measurement result of the frequency ratio and the movement average value of N measurement results of the frequency ratios, and the measurement interval of the frequency ratio can be controlled more appropriately.

Application Example 5

This application example is directed to an electronic apparatus including any one of the clock generating devices.

Application Example 6

The electronic apparatus according to the application example described above may further include a real time clock device that synchronizes with the second clock signal output by the clock generating device, and generates time information.

Application Example 7

This application example is directed to a moving object including any one of the clock generating devices.

Application Example 8

This application example is directed to a clock generating method including measuring a frequency ratio between a first clock signal and a reference frequency value based on a third clock signal; generating a second clock signal obtained by masking a portion of clocks of the first clock signal based on a measurement result of the frequency ratio; and controlling a measurement interval of the frequency ratio based on a difference between the measurement result of the frequency ratio and an average value of N (N is a natural number) measurement results of the frequency ratio.

BRIEF DESCRIPTION OF THE DRAWINGS

The invention will be described with reference to the accompanying drawings, wherein like numbers reference like elements.

FIG. 4 is a diagram illustrating a relationship among a measurement time, a reference value, a counter value of 25 MHz, the number of masks, a correction time, and correction precision.

DESCRIPTION OF EXEMPLARY EMBODIMENTS

Hereinafter, preferred embodiments of the invention are described with reference to the drawings. In addition, the embodiments described below are not intended to limit the invention. Further, not all the elements described below are essential for the invention.

1. Clock Generating Device

Figure 1:
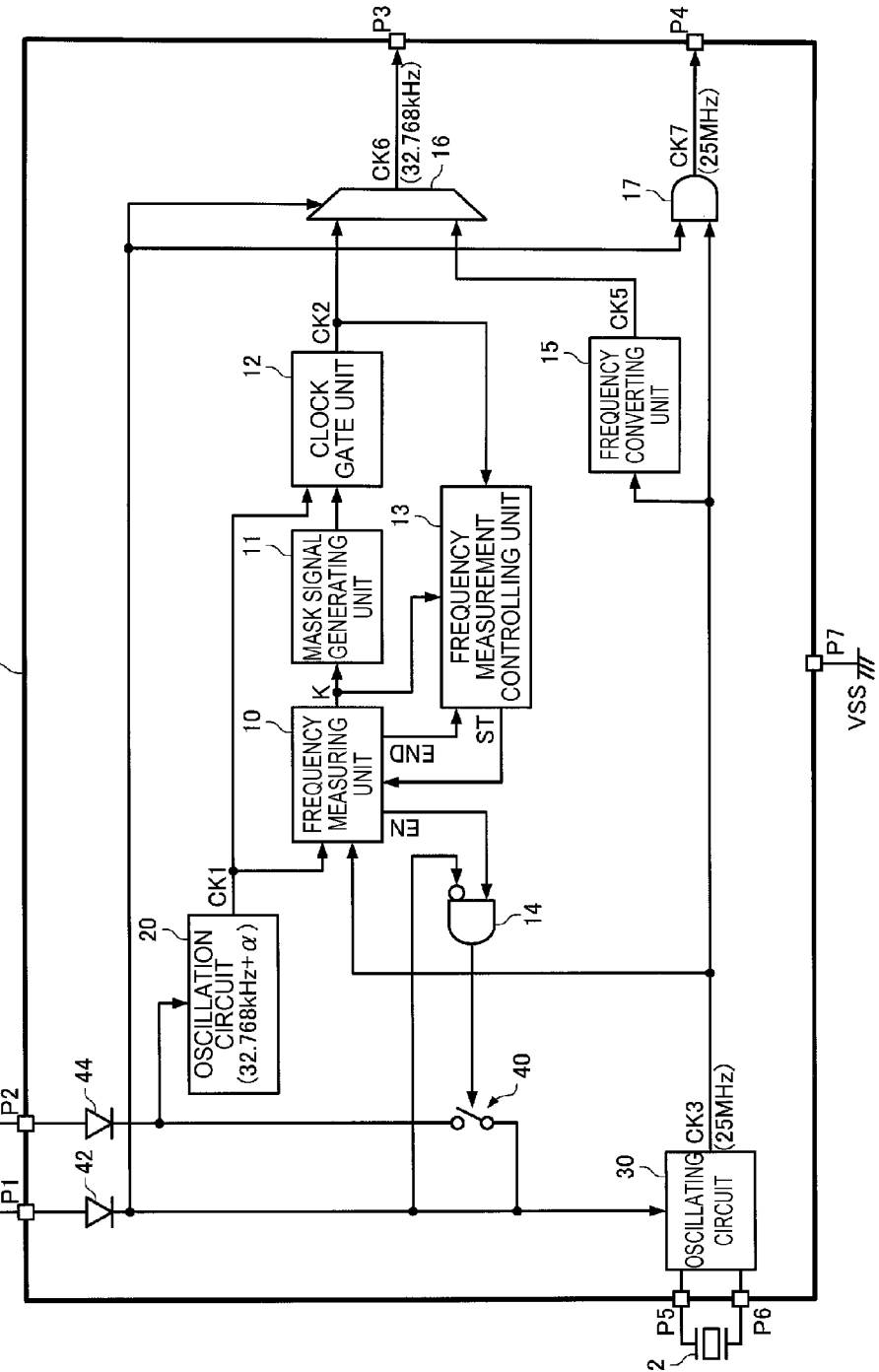
FIG. 1 is a diagram illustrating an exemplary configuration of a clock generating device according to the present embodiment.

FIG. 1 is a diagram illustrating an exemplary configuration of a clock generating device according to the present embodiment. A clock generating device 1 according to the present embodiment includes a frequency measuring unit 10, a mask signal generating unit 11, a clock gate unit 12, a frequency measurement controlling unit 13, an AND circuit 14, a frequency converting unit 15, a clock selecting unit 16, an AND circuit 17, an oscillation circuit 20, an oscillating circuit 30, a switch circuit 40, a diode 42, and a diode 44, to be realized as one chip of an integrated circuit (IC). However, the clock generating device 1 according to the present embodiment may omit or change a portion of these elements, or add another element.

The clock generating device 1 according to the present embodiment further includes a power supply terminal P1 (first power supply terminal) which is connected to the primary power supply and to which a power supply voltage VDD1 (first power supply voltage) is supplied from the primary power supply, a power supply terminal P2 (second power supply terminal) which is connected to a secondary power supply and to which a power supply voltage VDD2 (second power supply voltage) is supplied from the secondary power supply, output terminals P3 and P4 that respectively output two clock signals CK6 and CK7, two terminals P5 and P6 that are connected to a quartz resonator 2, and a grounding terminal P7.

The primary power supply connected to the P1 terminal is an AC power supply, a large capacity lithium ion battery, or the like, and the power supply voltage VDD1 is not supplied to the P1 terminal when the power supply to the apparatus (for example, a notebook computer or a tablet PC) including the clock generating device 1 is cut, or when the apparatus is in a power save mode. Meanwhile, the secondary power supply connected to the P2 terminal is a small capacity coin battery or the like, and the power supply voltage VDD2 is supplied all the time.

The oscillation circuit 20 is a circuit that operates with the power supply voltage VDD2 supplied from the P2 terminal through the diode 44, and oscillates at a frequency (32.768 kHz+α) higher than a predetermined frequency (32.768 kHz in the present embodiment). The oscillation circuit 20 is realized by, for example, a CR oscillation circuit, an LC oscillation circuit, a phase locked loop (PLL) circuit with an oscillation source, and a silicon micro electro mechanical systems (silicon MEMS). According to the present embodiment, the oscillation circuit 20 always oscillates at the frequency higher than 32.768 kHz in the all conditions such as variation in manufacturing, an operation temperature range, and an operation voltage range. For example, a method of securing a great margin at a frequency in a typical condition at the design stage so that the oscillation circuit 20 oscillates at a frequency higher than 32.768 kHz even in a condition in which the frequency is lowest, and a method of designing the oscillation circuit 20 so as to be capable of adjusting a frequency of the oscillation circuit 20, securing a margin in a certain degree at the design stage, and separately adjusting the frequency of the oscillation circuit 20 so that the frequency becomes higher than 32.768 kHz at a condition in which the frequency becomes minimum at the time of the shipping inspection, and the like are considered.

The oscillating circuit 30 is connected between the P5 terminal and the P6 terminal, operates with the power supply voltage VDD1 supplied from the P1 terminal through the diode 42, and causes the quartz resonator 2 to oscillate at a predetermined frequency (25 MHz in the present embodiment). If the power supply voltage VDD1 is not supplied to the P1 terminal, the operation of the oscillating circuit 30 stops when the switch circuit 40 is turned off, and the oscillating circuit 30 operates with the power supply voltage VDD2 supplied from the P2 terminal through the diode 44 when the switch circuit 40 is turned on.

A clock signal CK3 at 25 MHz output by the oscillating circuit 30 has higher frequency precision (smaller frequency deviation) and higher frequency stability than the clock signal CK1 at 32.768 kHz+α output by the oscillation circuit 20. Therefore, according to the present embodiment, in the frequency measuring unit 10, the mask signal generating unit 11, and the clock gate unit 12, the frequency of 32.768 kHz+α of the clock signal CK1 is measured by using the clock signal CK3, and a clock signal CK2 of 32.768 kHz corrected based on the measurement result is generated.

The frequency measuring unit 10 measures a ratio between a frequency of a clock signal CK1 (first clock signal) and a reference frequency value (32.768 kHz) with reference to the clock signal CK3 (third clock signal). The measurement value is identical to the number of masks of the clocks of the clock signal CK1 at a time (hereinafter, simply referred to as "correction time") $T_{comp}$ required in one correction. According to the present embodiment, when a measurement start signal ST (pulse signal) output by the frequency measurement controlling unit 13 described below is input, the frequency measuring unit 10 starts the measurement of a ratio between the frequency of the clock signal CK1 and the reference frequency value (32.768 kHz) (hereinafter, referred to as "frequency ratio measurement").

Especially, according to the present embodiment, the frequency measuring unit 10 down-counts the number of clocks of the clock signal CK3 included in the time (a measurement time $T_{meas}$) corresponding to a given number of clocks of the clock signal CK1 so that the down-counted counter value and the number of masks of the clocks of the clock signal CK1 for the correction time $T_{comp}$ become identical to each other.

Figure 2:
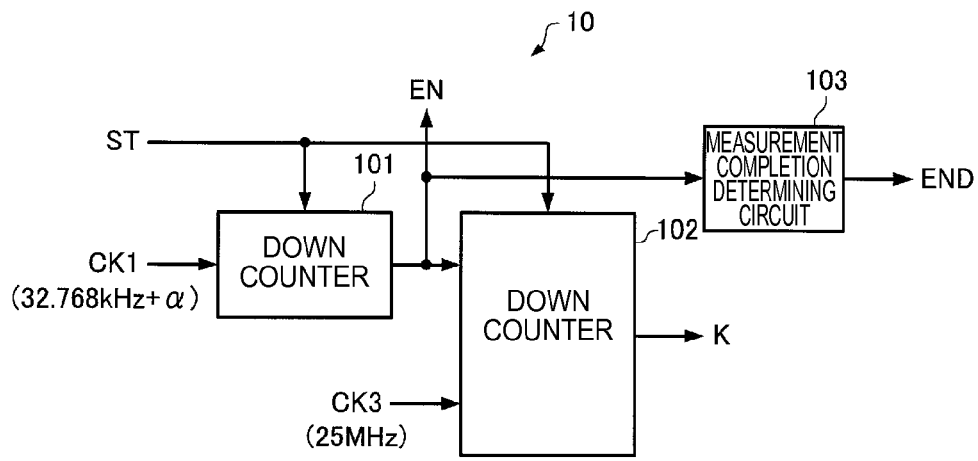
FIG. 2 is a diagram illustrating an exemplary configuration of a frequency measuring unit according to the present embodiment.

FIG. 2 is a diagram illustrating an exemplary configuration of the frequency measuring unit 10 according to the present embodiment. In the example of FIG. 2, the frequency measuring unit 10 includes a down counter 101, a down counter 102, and a measurement completion determining circuit 103.

The down counter 101 outputs a low level signal until the measurement start signal ST is supplied, outputs a high level signal when the measurement start signal ST is supplied, and counts down N clocks of the clock signal CK1. The output of the down counter 101 is maintained to be at a high level for a time corresponding to the N clocks of the clock signal CK1. The output signal of the down counter 101 is an enable signal EN indicating that the frequency ratio is being measured, and the time at which the output is maintained to be at the high level is to be the measurement time $T_{meas}$. For example, when N=1024, the measurement time $T_{meas}$ becomes the time corresponding to 1024 clocks of the clock signal CK1.

The down counter 102 counts down the number of clocks of the clock signal CK3 input while the output signal of the down counter 101 is maintained to be at the high level. The initial value of the down counter 102 is a counter value (=25 MHz/32.768 kHz×N) obtained by counting a period corresponding to N cycles of 32.768 kHz by 25 MHz.

When a change of the output signal of the down counter 101 from the high level to the low level is detected, the measurement completion determining circuit 103 generates a measurement completion signal END (pulse signal), and outputs the measurement completion signal to the frequency measurement controlling unit 13 described below.

A value identical to the number of masks of the clocks of the clock signal CK1 for each correction time $T_{comp}$ can be obtained by measuring the output signal value (the output signal value of the down counter 102) K of the frequency measuring unit 10 configured as described above.

Figure 3A:
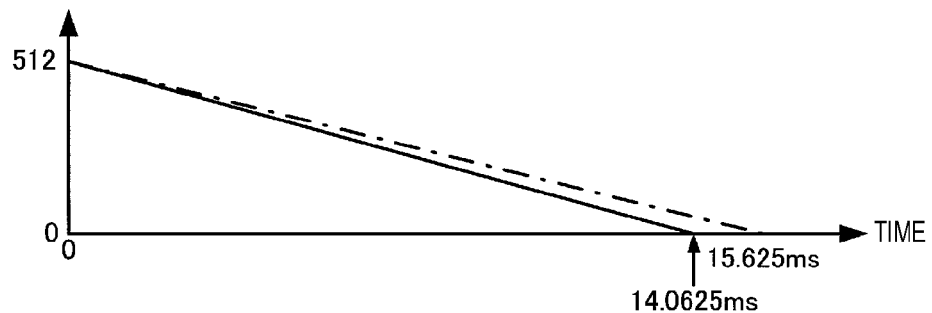
FIGS. 3A and 3B are diagrams illustrating a relationship between an output signal value of a frequency measuring unit and the number of masks.

Next, a relationship between the signal value K and the number of masks is described with reference to FIGS. 3A and 3B. The time corresponding to 512 clocks of 32.768 kHz is 15.625 ms (alternate long and short dashed line of FIG. 3A), and the time 15.625 ms is identical to the time corresponding to 390,625 clocks of 25 MHz (solid line of FIG. 3B). As described above, the value of 390,625 corresponds to a reference value F.

Figure 3B:
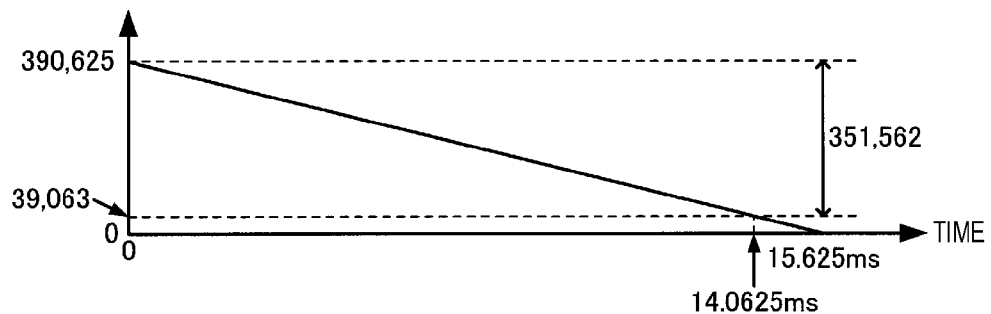

In addition, if the cycle of 32.768 kHz+α corresponds to the 10% reduction (α=32.768 kHz×⅑) of the cycle of 32.768 kHz, the time corresponding to 512 clocks of 32.768 kHz+α (corresponding to the measurement time $T_{meas}$) is 14.0625 ms (solid line of FIG. 3A), and the value of 14.0625 ms is substantially identical to the time corresponding to 351,562 clocks of 25 MHz (solid line of FIG. 3B). The value of 351,562 corresponds to the reduction value of the counter value of the down counter 102 in which 390,625 (the reference value F) is set to be the initial value. The value of the down counter 102 after the measurement time $T_{meas}$ passes is 39,063 which is the difference between 390,625 (the reference value F) which is the initial value of the down counter 102 and 351,562 (the reduction value of the counter value of the down counter 102). The value corresponds to a signal value K.

Meanwhile, since the cycle of 32.768 kHz+α is a 10% reduction of the cycle of 32.768 kHz, clocks corresponding to the 10% may be masked in order to correct 32.768 kHz+α to 32.768 kHz. Accordingly, 390,625 clocks (the reference value F) which is 32.768 kHz+α can be corrected to 32.768 kHz by masking 39,063 clocks (the signal value K) which is substantially the 10%. That is, the clocks of the clock signal CK1 may be masked by K times for each of the correction time $T_{comp}$, and the signal value K becomes the number of masks without change.

FIG. 4 is a diagram illustrating a relationship among the measurement time $T_{meas}$, the reference value F, a counter value of 25 MHz, the number of masks K, the correction time $T_{comp}$, and the correction precision. FIG. 4 is an example of a case in which the cycle of 32.768 kHz+α corresponds to a 10% reduction of the cycle of 32.768 kHz (α=32.768 kHz×⅑). For example, when the time corresponding to 64 clocks of the clock signal CK1 (32.768 kHz+α) is set to be the measurement time $T_{meas}$ (N of the down counter 101=64), the measurement time $T_{meas}$ is 1.7578125 ms, the reference value F is 48,828, the number of counts of the clock signal CK3 (25 MHz) is 43,945, the number of masks K is 4,883, the correction time $T_{comp}$ is 1.34 s (the time corresponding to 48,828 clocks of the clock signal CK1), and the correction precision is 20.48 ppm. In addition, for example, when the time corresponding to 512 clocks of the clock signal CK1 (32.768 kHz+α) is set to be the measurement time $T_{meas}$ (when N of the down counter 101=512), the measurement time $T_{meas}$ is 14.6025 ms, the reference value F is 390,625, the number of counts of the clock signal CK3 (25 MHz) is 351,562, the number of masks K is 39,063, the correction time $T_{comp}$ is 10.73 s (time corresponding to 390,625 clocks of the clock signal CK1), and the correction precision is 2.56 ppm. As illustrated in FIG. 4, as the measurement time $T_{meas}$ increases, the correction precision becomes higher.

With reference to FIG. 1, the mask signal generating unit 11 generates the mask signal for controlling the masking timing of the clock gate unit 12 according to the number of masks (output signal value) K calculated by the frequency measuring unit 10.

The clock gate unit 12 performs masking according to the mask signal generated by the mask signal generating unit 11 so that a portion of clocks included in the clock signal CK1 is not propagated, and generates the clock signal CK2 (second clock signal) which has a predetermined number of clocks for each predetermined time, and of which the average frequency is 32.768 kHz.

For example, if the mask signal generating unit 11 generates a mask signal that is at the high level by continuing or dispersing the clock signal CK1 by K clocks for the correction time $T_{comp}$, and the clock gate unit 12 is realized to be a 2-input AND circuit to which the clock signal CK1 and the mask signal are input, the output signal of the corresponding 2-input AND circuit becomes the clock signal CK2 of which the average frequency is 32.768 kHz.

When the power supply voltage VDD1 is not supplied to the P1 terminal, the clock signal CK2 output by the clock gate unit 12 is selected by the clock selecting unit 16, and is output to the outside through the P3 terminal, as the clock signal CK6. Accordingly, the clock generating device 1 according to the present embodiment outputs the clock signal CK6 of which clocks are dense, but, for example, if the clock generating device 1 is a timer equipment that clocks time of several tens of milliseconds or several hundreds of milliseconds, such as a real time clock (RTC), there is no problem even if the clock generating device 1 operates with the clock signal CK6 which is a little bit dense. However, when the correction should be performed, for example, at the precision of 2.56 ppm, as illustrated in FIG. 4, the correction time $T_{comp}$ becomes about 11 seconds, and if the clock signal CK1 is masked to continue the clocks of the clock signal CK1 by K times, the clocks of the clock signal CK6 may stop for about 1 second. In this case, inconvenience such as a hand in an analog clock that drives its hands by using the clock signal CK6 may stop for about 1 second, or a music reproducing apparatus that plays an electronic melody using the clock signal CK6 may produce a sound with an odd rhythm for a moment may occur.

Therefore, according to the present embodiment, for the correction time $T_{comp}$, the mask signal generating unit 11 generates a mask signal that causes timings for masking the clocks of the clock signal CK1 to be dispersed as evenly as possible.

Figure 5:
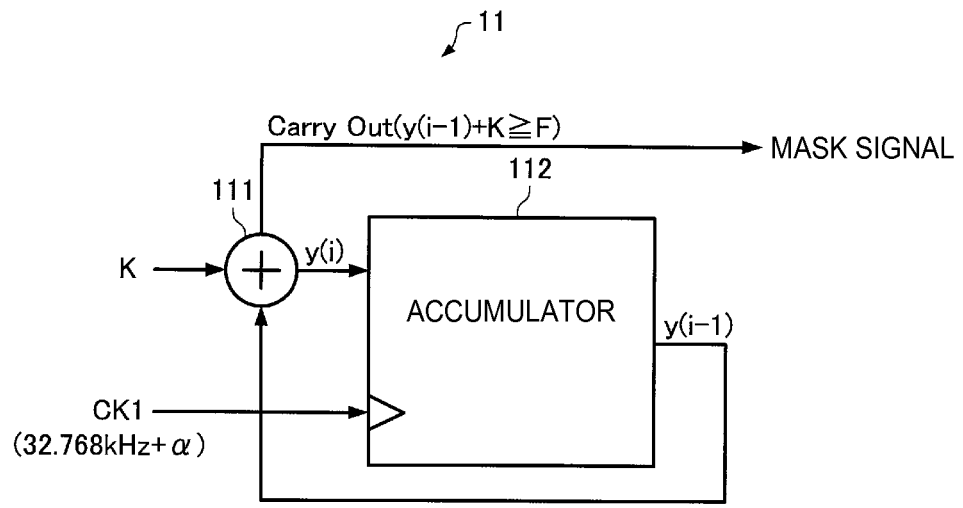
FIG. 5 is a diagram illustrating an exemplary configuration of a mask signal generating unit.

FIG. 5 is a diagram illustrating an exemplary configuration of the mask signal generating unit 11 according to the present embodiment. In the example of FIG. 5, the mask signal generating unit 11 includes an adder circuit 111 with a carry-out output and an accumulator 112.

The adder circuit 111 adds and outputs the number of masks (the output signal value of the frequency measuring unit 10) K and the output value y(i−1) of the accumulator 112. However, the upper limit of the output signal value y(i) of the adder circuit 111 is the reference value F−1, and y(i)=(y(i−1)+K) mod F (y(i) is a remainder when (y(i−1)+K) is divided by F) is satisfied. In addition, the adder circuit 111 generates and outputs the mask signal that is at the low level when y(i−1)+K<F, and that is at the high level when y(i−1)+K≥F. Here, the time corresponding to F clocks of the clock signal CK1 is the correction time $T_{comp}$, and the reference value F is set in association with the set of the measurement time $T_{meas}$. Further, the value of the reference value F or the value of N for determining the measurement time $T_{meas}$ may be fixed at the design stage, or may be set to be changed by the setting of the internal register.

The accumulator 112 is a register that stores the output signal value y(i) of the adder circuit 111 when the clocks of the clock signal CK1 are input. Accordingly, every time the clocks of the clock signal CK1 are input, the output signal value y(i−1) of the accumulator 112 is updated to the output signal value y(i) of the adder circuit 111.

Figure 6:
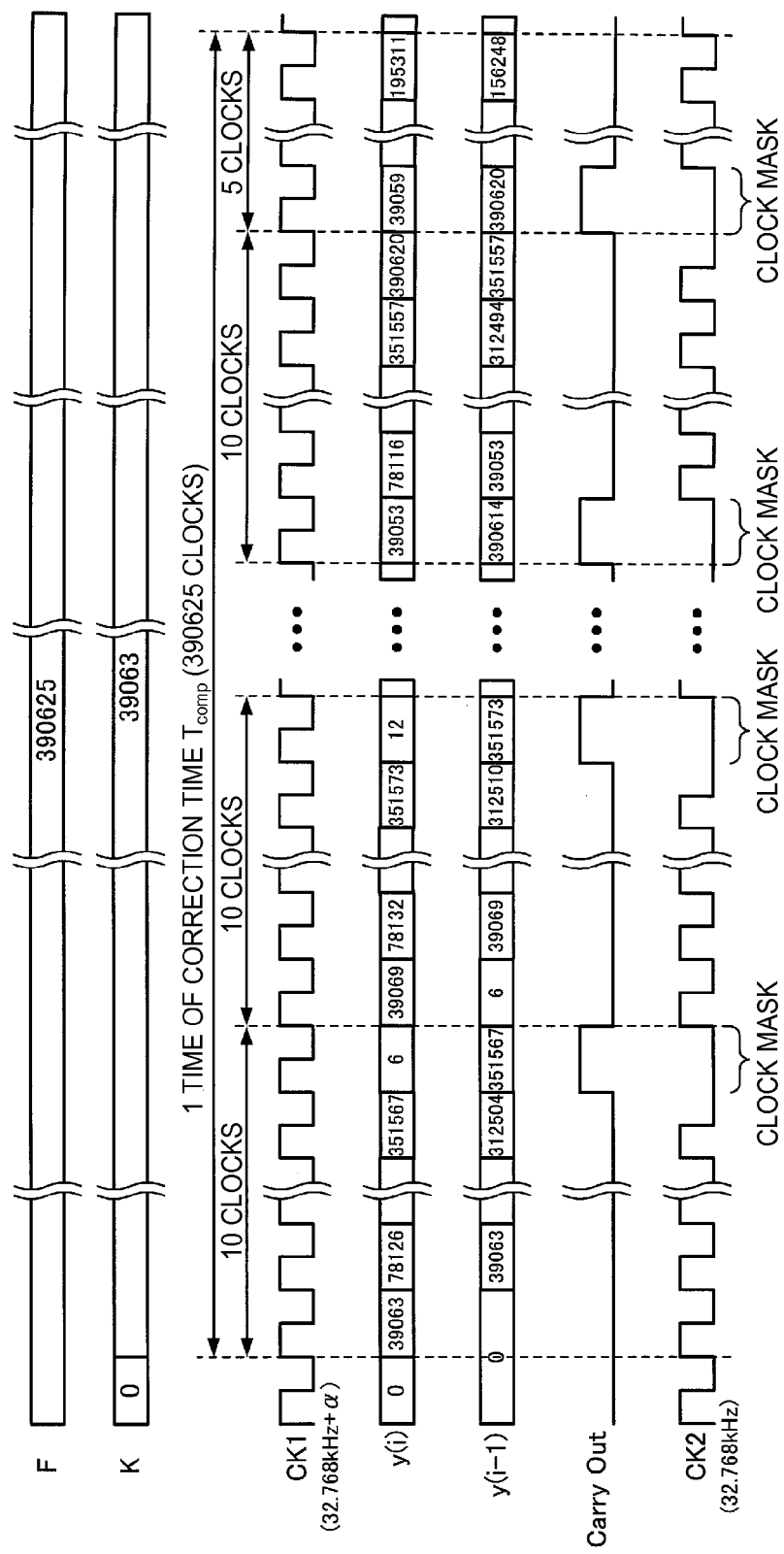
FIG. 6 is a diagram illustrating an exemplary timing chart of an operation of the mask signal generating unit.

FIG. 6 is a diagram illustrating an exemplary timing chart of an operation of the mask signal generating unit 11. FIG. 6 is a diagram illustrating an example in which the cycle of 32.768 kHz+α corresponds to the 10% reduction of the cycle of 32.768 kHz (α=32.768 kHz×⅑), the measurement time $T_{meas}$ is set to be a time corresponding to 512 clocks of the clock signal CK1, and the reference value F in association with this is set to be 390,625. That is, the correction time $T_{comp}$ corresponds to the time for 390,625 clocks of the clock signal CK1. Since the number of masks (the output signal value of the frequency measuring unit 10) K is 39,063, for the correction time $T_{comp}$, 39,063 clocks (10%) among 390,625 clocks of the clock signal CK1 are masked. As illustrated in FIG. 6, since 1 clock for every 10 clocks is masked in the clock signal CK1, the timings of the clock mask can be substantially evenly dispersed with a simple configuration of FIG. 5.

When a first correction (the correction time $T_{comp}$) ends, the clock generating device 1 according to the present embodiment performs a second correction for the correction time $T_{comp}$ which is identical to the first correction with the value K which is identical to the first correction. Thereafter, the same corrections are repeated in the same manner until a next frequency ratio measurement is performed. Then, if a predetermined interval time $T_{int}$ passes after the start of the previous frequency ratio measurement, the clock generating device 1 updates the signal value K by performing a new frequency ratio measurement.

With reference to FIG. 1, the frequency measurement controlling unit 13 measures the interval time $T_{int}$ by counting the number of clocks of the clock signal CK2 output by the clock gate unit 12, and also supplies the measurement start signal ST to the frequency measuring unit 10 every time the interval time $T_{int}$ is measured.

Figure 7:
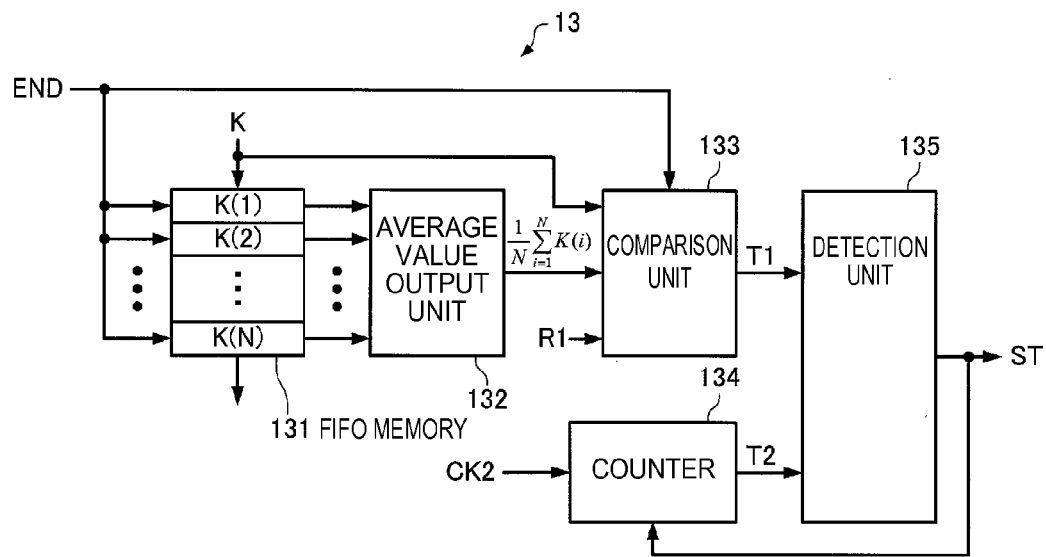
FIG. 7 is a diagram illustrating an exemplary configuration of a frequency measurement controlling unit.

FIG. 7 is a diagram illustrating an exemplary configuration of the frequency measurement controlling unit 13 according to the present embodiment. In the example of FIG. 7, the frequency measurement controlling unit 13 includes a first-in first-out (FIFO) memory 131, an average value output unit 132, a comparison unit 133, a counter 134, and a detection unit 135.

The FIFO memory 131 stores N (N is a natural number) numbers of masks (the output signal value of the frequency measuring unit 10) K (K(1) to K(N)) in series. The FIFO memory 131 moves the respective values of K(i) to K(i+1) (i=1 to N−1) every time the measurement completion signal END is input from the frequency measuring unit 10, and stores a newest number of masks K as K(1). At this point, K(N) is removed (erased) from the FIFO memory 131.

The average value output unit 132 calculates and outputs the average value (movement average value) of N numbers of masks K (K(1) to K(N)) stored in the FIFO memory 131. If $2^n$ (n is 0 or a natural number) is selected as N, an average value can be obtained by rounding down (or rounding up/down) lower n bits of the addition result of K(1) to K(N). Therefore, a divider is not required.

The comparison unit 133 calculates a difference (an absolute value of a difference) between a newest number of masks K and an average value (the movement average value) of N number of masks K, compares a corresponding difference when the measurement completion signal END is input and a reference value R1, and outputs a value T1 according to the comparison result. The reference value R1 may be a threshold value in which the value T1 is substituted and be fixed at the design stage, or may be set to be changed by the setting of the internal register. According to the present embodiment, the comparison unit 133 outputs T1=A (>B) if the difference between the newest number of masks K and the average value (movement average value) of the N numbers of masks K is within R1, or outputs T1=B (<A) if the difference is greater than R1.

Further, when N=1, the average value output unit 132 outputs the number of masks K(1) stored in the FIFO memory 131 without change, and the comparison unit 133 calculates the difference between the newest number of masks K and the previous number of masks K(1), and compares the corresponding difference obtained when the measurement completion signal END is input, with the reference value R1.

The counter 134 is an up counter that counts the number of clocks of the clock signal CK2, and outputs a counter value T2.

The detection unit 135 compares the output value T1 of the comparison unit 133 and the output value T2 of the counter 134, and outputs the measurement start signal ST based on the comparison result. According to the present embodiment, the detection unit 135 outputs the measurement start signal ST that is at the high level when T2=T1 (or when T2≥T1). When the measurement start signal ST is at the high level, the counter 134 is reset to be 0.

Figure 8A:
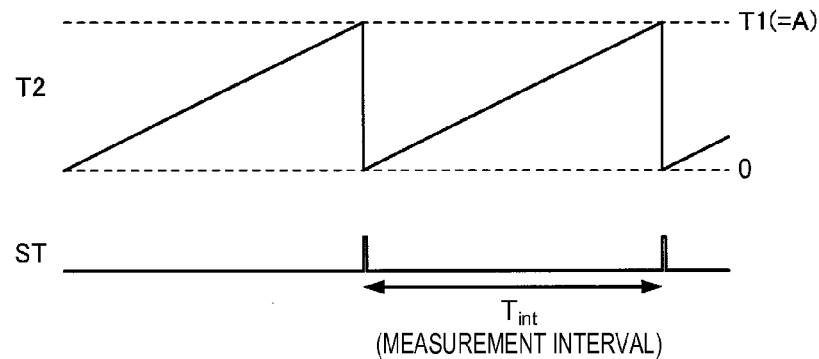
FIGS. 8A and 8B are diagrams illustrating an exemplary timing chart of an operation of the frequency measurement controlling unit.
Figure 8B:
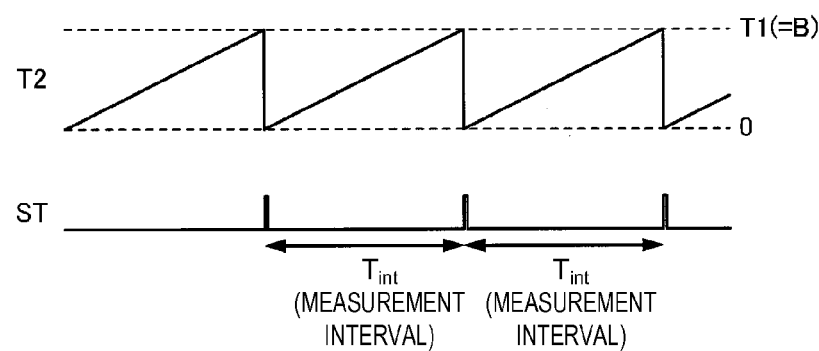

FIGS. 8A and 8B are diagrams illustrating an exemplary timing chart of the counter value T2 and the measurement start signal ST of the counter 134. FIG. 8A is a diagram illustrating an example when T1=A (>B), that is, the difference between the newest number of masks K and the average value (movement average value) of the N numbers of masks K is within R1. Meanwhile, FIG. 8B is a diagram illustrating an example when T1=B (<A), that is, when the difference between the newest number of masks K and the average value (movement average value) of the N number of masks K is greater than R1.

Every time the counter value T2 of the counter 134 reaches T1, a pulse of the measurement start signal ST is generated. The generation interval is long in FIG. 8A, and short in FIG. 8B. As described above, since the measurement start signal ST is a signal that indicates that the frequency measuring unit 10 starts the frequency ratio measurement, the pulse generation interval of the measurement start signal ST is identical to the interval time (the measurement interval of the frequency ratio) $T_{int}$. That is, the detection unit 135 controls the measurement interval of the frequency ratio corresponding to the value of T1, and the frequency measuring unit 10 intermittently performs the frequency ratio measurement for each of the interval time $T_{int}$.

When the environment such as the temperature or the power supply voltage greatly changes, the number of masks K drastically changes. Therefore, if the cycle for updating the number of masks K is caused to be short by frequently performing the frequency ratio measurement, the correction precision of the frequency decreases. Meanwhile, when the environment such as the temperature or the power supply voltage changes little, the number of masks K rarely or slightly changes. Therefore, it is possible to decrease the unnecessary electricity consumption while maintaining the correction precision of the frequency, by causing the interval of the frequency ratio measurement to be long. Accordingly, according to the present embodiment, when the difference between the newest number of masks K and the movement average value of the previous N numbers of masks K is within the reference value R1, the frequency ratio measurement is performed for each of the general interval time $T_{int}$ (measurement interval). If the corresponding difference is greater than the reference value R1, the frequency ratio measurement is performed by causing the interval time $T_{int}$ (measurement interval) to be short.

Further, the value of the interval time $T_{int}$ (the value of T1 that determines $T_{int}$ in reality) may be appropriately selected considering the environmental conditions, an acceptable range of the frequency correction error, or the like, and be fixed at the design stage, or may be set to be changed by the setting of the internal register or by the setting of the nonvolatile memory.

Figure 9A:
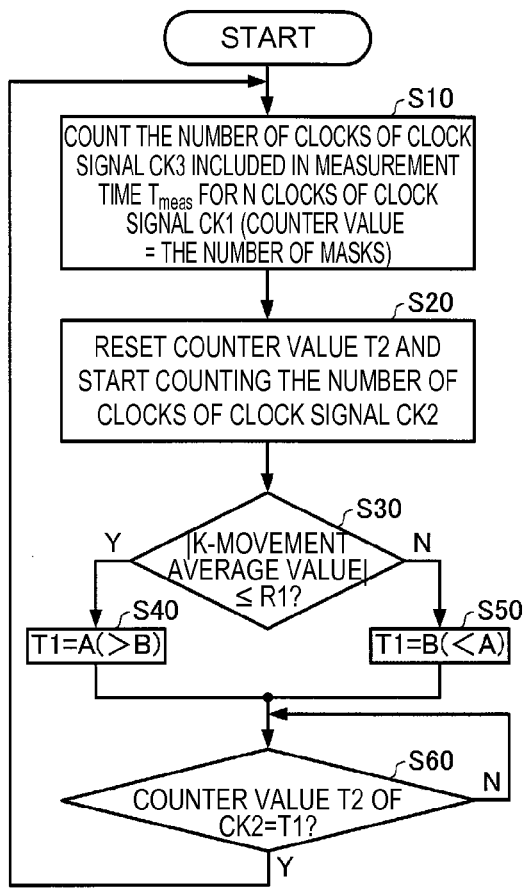
FIGS. 9A and 9B are flow charts illustrating a mask signal generating process according to the present embodiment.
Figure 9B:
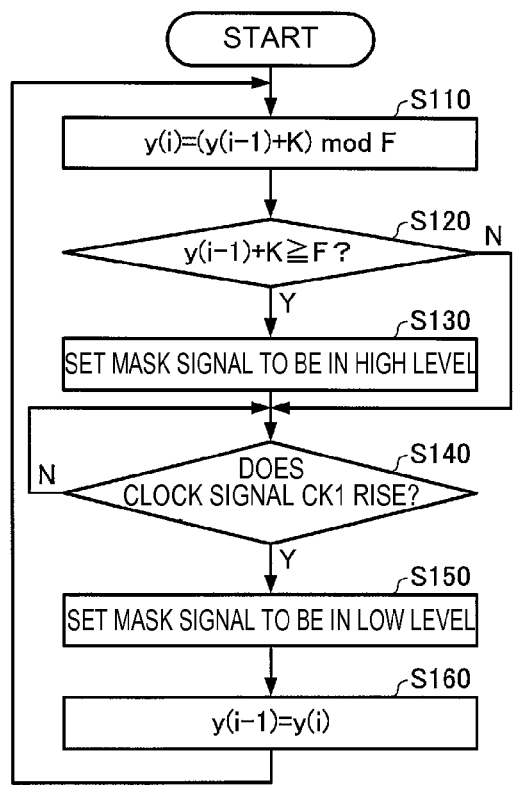

FIGS. 9A and 9B are flow charts illustrating the mask signal generating process described above. FIG. 9A is a flow chart of the frequency ratio measurement, and FIG. 9B is a flow chart of the frequency correction. The frequency ratio measurement and the frequency correction are performed in parallel.

In the flow chart of the frequency ratio measurement illustrated in FIG. 9A, the clock generating device 1 firstly counts the number of clocks of the clock signal CK3 included in the measurement time $T_{meas}$ for N clocks of the clock signal CK1 (S10). Here, the obtained counter value is identical to the number of masks K.

Next, the clock generating device 1 resets the counter value T2, and starts to count the number of clocks of the clock signal CK2 (S20).

Next, when the difference (the absolute value of the difference) between the number of masks K obtained in Step S10 and the average value of the previous N numbers of masks K (movement average value) is within the reference value R1 (Yes in S30), the clock generating device 1 sets T1=A (>B) (S40), and sets T1=B (<A) when the difference is greater than the reference value R1 (No in S30) (S50).

Then, every time the counter value T2 of the number of clocks of the clock signal CK2 is identical to T1 (that is, the interval time $T_{int}$ passes) (Yes in S60), the clock generating device 1 repeats the processes after Step S10.

In the flow chart of the frequency correction illustrated in FIG. 9B, the clock generating device 1 firstly calculates y(i)=(y(i−1)+K) mod F from the output value y(i−1) of the accumulator 112, the number of masks K (the newest number of masks K obtained in Step S10 of FIG. 9A), and the reference value F (S110).

Next, if y(i−1)+K≥F (Yes in S120), the clock generating device 1 sets the mask signal to be at the high level (S130), at the timing of the next rising edge of the clock signal CK1 (Yes in S140), the clock generating device 1 sets the mask signal to be at the low level (S150), and updates the output value y(i−1) of the accumulator 112 to y(i) (S160).

Meanwhile, if y(i−1)+K<F (No in S120), at the timing of the next rising edge of the clock signal CK1 (Yes in S140), the clock generating device 1 maintains the mask signal to be at the low level (S150), and updates the output value y(i−1) of the accumulator 112 to y(i) (S160).

Then, the clock generating device 1 performs the processes of Steps S110 to S160 by using the newest number of masks K obtained in Step S10 of FIG. 9A.

With reference to FIG. 1, the enable signal EN is supplied to the non-inverted input of the AND circuit 14, and the voltage of the P1 terminal is supplied to the inverted input of the AND circuit 14 through the diode 42. Accordingly, the AND circuit 14 always outputs a low level signal when the power supply voltage VDD1 is supplied to the P1 terminal. When the power supply voltage VDD1 is not supplied to the P1 terminal, the AND circuit 14 outputs a high level signal in the period when the enable signal EN is at the high level, and outputs a low level signal in the period when the enable signal EN is at the low level.

The output signal of the AND circuit 14 is supplied to the control input of the switch circuit 40, and the switch circuit 40 is turned on when the output signal of the AND circuit 14 is at the high level (electrically connects 2 terminals), and is turned off when the output signal is at the low level (electrically blocks 2 terminals).

Accordingly, when the power supply voltage VDD1 is supplied to the P1 terminal, the switch circuit 40 is always turned off. Therefore, the power supply voltage VDD2 is not supplied to the oscillating circuit 30, only the power supply voltage VDD1 is supplied, and the clock signal CK3 is output. Meanwhile, when the power supply voltage VDD1 is not supplied to the P1 terminal, only when the frequency measuring unit 10 performs the measurement (when the enable signal EN is at the high level), the power supply voltage VDD2 is supplied to the oscillating circuit 30 and the clock signal CK3 is output.

Figure 10:
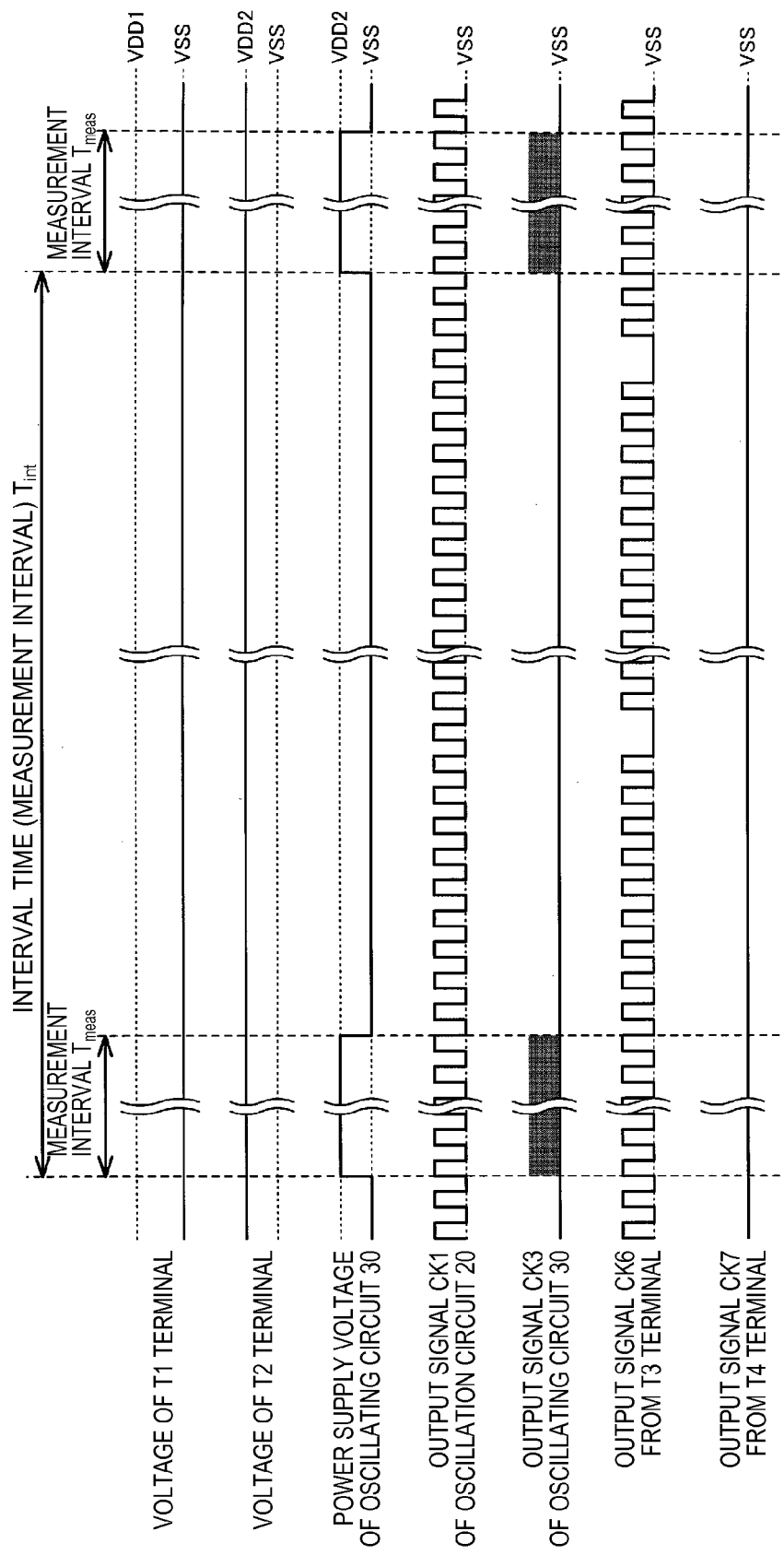
FIG. 10 is a diagram illustrating an exemplary timing chart when a power supply voltage is not supplied from a primary power supply.

When the power supply voltage VDD1 is supplied to the P1 terminal, the clock signal CK3 passes through the AND circuit 17, and is output to the outside through the P4 terminal, as the clock signal CK7. Meanwhile, when the power supply voltage VDD1 is not supplied to the P1 terminal, the clock signal CK3 generated in the measurement period of the frequency measuring unit 10 is masked in the AND circuit 17, and is not output to the outside. FIG. 10 is a diagram illustrating an exemplary timing chart when the power supply voltage VDD1 is not supplied to the P1 terminal.

When the power supply voltage VDD1 is supplied to the P1 terminal, the frequency converting unit 15 converts the frequency of the clock signal CK3, and generates the clock signal CK5 of which an average frequency is a predetermined frequency (32.768 kHz in the present embodiment).

The frequency converting unit 15 may generate the clock signal with the average frequency of 32.768 kHz by dividing the frequency of the clock signal CK3 by changing the plurality of division ratios by using the division circuit of which the division ratio can be changed. For example, the clock signal CK5 with the average frequency of 32.768 kHz can be obtained by sequentially repeating 481 times of 763 frequency division and 31 times of 762 frequency division on the clock signal CK3.

Figure 11:
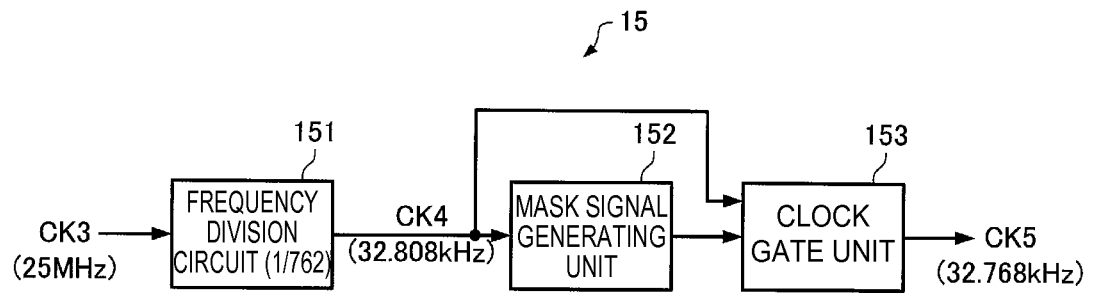
FIG. 11 is a diagram illustrating an exemplary configuration of a frequency converting unit.

Otherwise, the frequency converting unit 15 may have the configuration illustrated in FIG. 11. In the example of FIG. 11, the frequency converting unit 15 includes a frequency division circuit 151, a mask signal generating unit 152, and a clock gate unit 153. The frequency division circuit 151 receives an input of the clock signal CK3 (third clock signal), divides the frequency of the clock signal CK3 at a predetermined division ratio, and generates a clock signal CK4 at the frequency higher than 32.768 kHz. According to the present embodiment, the frequency division circuit 151 divides the clock signal CK3 by the frequency of 762 to obtain the clock signal CK4 of 32.808 kHz (=25 MHz/762).

The mask signal generating unit 152 generates a mask signal for controlling the masking timing of the clock gate unit 153 based on the information on a predetermined number of masks for each predetermined number of clocks of the clock signal CK4.

The clock gate unit 153 masks a portion of clocks included in the output clock signal CK4 of the frequency division circuit 151 so as not to be propagated according to the mask signal generated by the mask signal generating unit 152, and generates a clock signal CK5 having the relatively high average frequency of 32.768 kHz.

For example, the number of clocks of 32.768 kHz included in the time corresponding to 390,625 clocks of 32.808 kHz is 390,144, and the difference is 481. Accordingly, for example, the mask signal generating unit 152 generates the mask signal for masking 481 clocks for each 390,625 clocks of the clock signal CK4, and the clock gate unit 153 may be realized with a 2-input AND circuit to which the clock signal CK4 and the mask signal are input.

Figure 12:
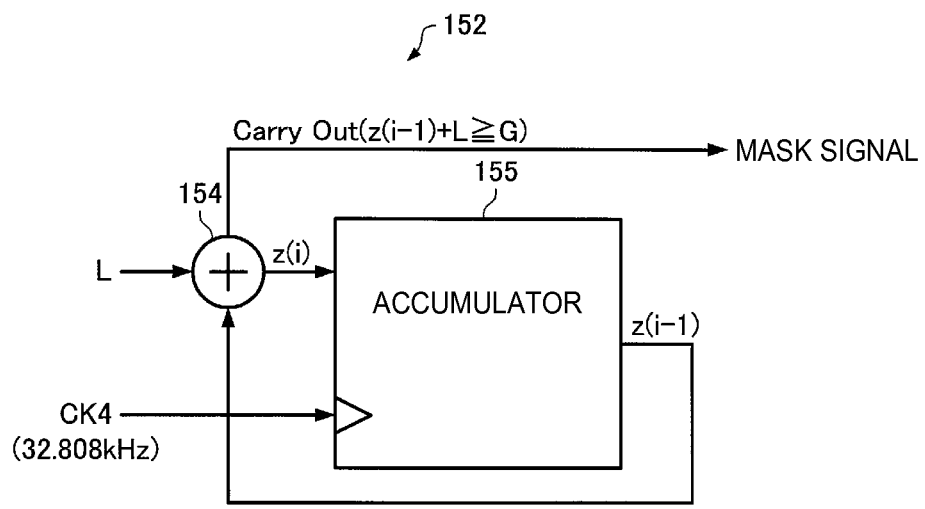
FIG. 12 is a diagram illustrating an exemplary configuration of a mask signal generating unit.

According to the present embodiment, the mask signal generating unit 152 generates a mask signal so as to disperse timing for masking clocks of the clock signal CK4 as evenly as possible, in the same manner as the mask signal generating unit 11. FIG. 12 is a diagram illustrating an exemplary configuration of the mask signal generating unit 152 according to the present embodiment. In the example of FIG. 12, the mask signal generating unit 152 includes an adder 154 with a carry-out output and an accumulator 155.

The adder 154 adds and outputs a specified value L and the output value y(i−1) of the accumulator 155. However, the upper limit of the output signal value z(i) of the adder 154 is G−1, z(i)=(z(i−1)+L) mod G (z(i) is a remainder when (z(i−1)+L) is divided by G). In addition, the adder 154 generates and outputs a mask signal that is at the low level when z(i−1)+L<G, and at the high level when z(i−1)+L≥G. Here, for example, the specified value L is the number of masks for each G clocks of the clock signal CK4, G is 390,625, and L is 481. Further, the value of L or the value of G may be fixed at the design stage, or may be set to be changed by the setting of the internal register.

The accumulator 155 is a register that stores the output signal value z(i) of the adder 154 when the clock of the frequency division clock signal CK4 is input. Accordingly, every time the clocks of the frequency division clock signal CK4 are input, the output signal value z(i−1) of the accumulator 155 is updated to the output signal value z(i) of the adder 154.

Figure 13:
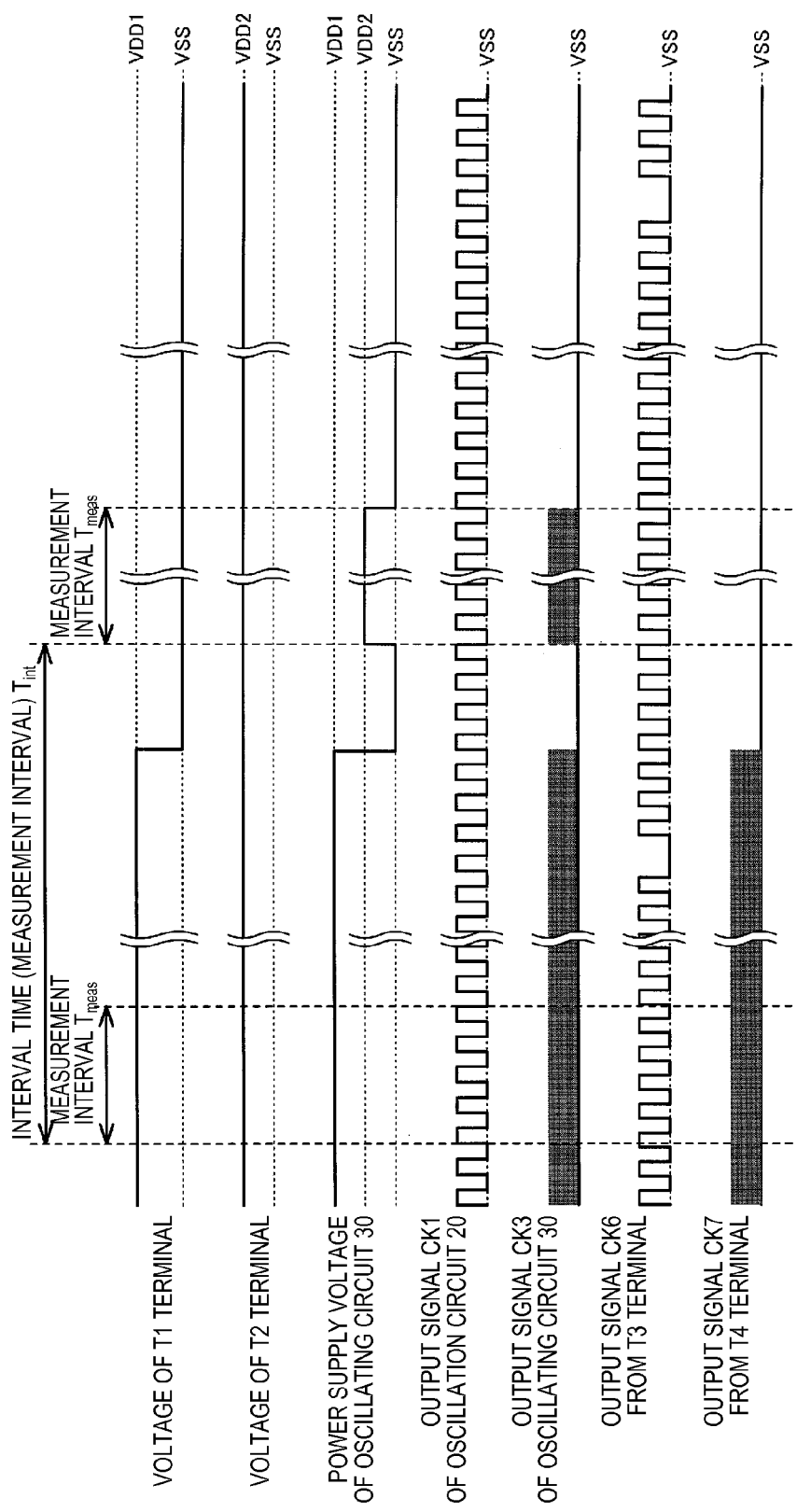
FIG. 13 is a diagram illustrating an exemplary timing chart right after the power supply voltage to be supplied from the primary power supply is stopped.

In the clock generating device 1 according to the present embodiment, when the power supply voltage VDD1 is supplied to the P1 terminal, the clock signal CK5 output by the clock gate unit 153 is selected by the clock selecting unit 16, and is output to the outside through the P3 terminal as the clock signal CK6. In addition, as described above, when the power supply voltage VDD1 is not supplied to the P1 terminal, the clock signal CK2 output by the clock gate unit 12 is selected by the clock selecting unit 16, and is output to the outside through the P3 terminal as the clock signal CK6. FIG. 13 is a diagram illustrating an exemplary timing chart of an operation of the clock generating device 1 right after the power supply voltage VDD1 to be supplied to the P1 terminal is stopped. Further, according to the present embodiment, since it is not known when the supply of the power supply voltage VDD1 from the primary power supply stops, the oscillation operation of the oscillation circuit 20 is set to continue all the time. Therefore, when the power supply voltage VDD1 is supplied, the frequency ratio measurement of the clock signal CK1 by the frequency measuring unit 10 is intermittently performed.

As described above, in the clock generating device according to the present embodiment, it is possible to generate the clock signal CK2 with the average frequency of 32.768 kHz without requiring the frequency adjustment of the oscillation circuit 20 by masking a portion of clocks of the clock signal CK1 which is higher than 32.768 kHz.

In addition, in the clock generating device according to the present embodiment, since the number of masks K of the clock signal CK1 is directly measured with reference to the clock signal CK3, it is possible to generate the clock signal CK2 with the high frequency precision according to the frequency precision of the clock signal CK3.

In addition, in the clock generating device according to the present embodiment, the number of masks K of the clock signal CK1 can be directly calculated with a simple configuration by counting the number of clocks of the clock signal CK3 included in the time corresponding to predetermined clocks of the clock signal CK1. At the same time, the desired correction precision can be achieved and the measurement time can be reduced by using the clock signal CK3 with a sufficiently high frequency with respect to the clock signal CK1.

In addition, in the clock generating device according to the present embodiment, it is possible to generate the clock signal CK2 in which timings for masking the clocks of the clock signal CK1 are dispersed as evenly as possible with a simple configuration by configuring the mask signal generating unit 11 by using the adder circuit 111 and the accumulator 112.

In addition, in the clock generating device according to the present embodiment, when the power supply voltage VDD1 is supplied to the P1 terminal, since the clock signal CK5 which is directly generated from the clock signal CK3 is selected and output. Therefore, it is possible to output the clock signal of 32.768 kHz with the higher frequency precision than the clock signal CK2. Meanwhile, even when the power supply voltage VDD1 is not supplied to the P1 terminal, it is possible to output the clock signal of 32.768 kHz by selecting the clock signal CK2 generated from the clock signal CK1 with the power supply voltage VDD2 which is always supplied to the P2 terminal, as the power supply voltage.

In addition, in the clock generating device according to the present embodiment, it is possible to generate the clock signal CK5 in which the timings for masking the clocks of the clock signal CK4 are dispersed as evenly as possible with a simple configuration by configuring the mask signal generating unit 152 by using the adder 154 and the accumulator 155.

In addition, in the clock generating device according to the present embodiment, if the power supply voltage VDD2 is supplied, the frequency of the clock signal CK1 is intermittently measured. Every time the supply of the power supply voltage VDD1 stops, it is possible to quickly generate the clock signal CK2 in which the frequency correction is appropriately performed on the clock signal CK1 by using the latest measurement result. Further, even after the supply of the power supply voltage VDD1 stops, the frequency of the clock signal CK1 is intermittently measured. Therefore, it is possible to reduce the influence on the frequency change in the clock signal CK1 caused by the change of the environment and to continuously generate the clock signal CK2 with a substantially constant frequency while reducing the electric power consumption.

2. Electronic Apparatus

Figure 14:
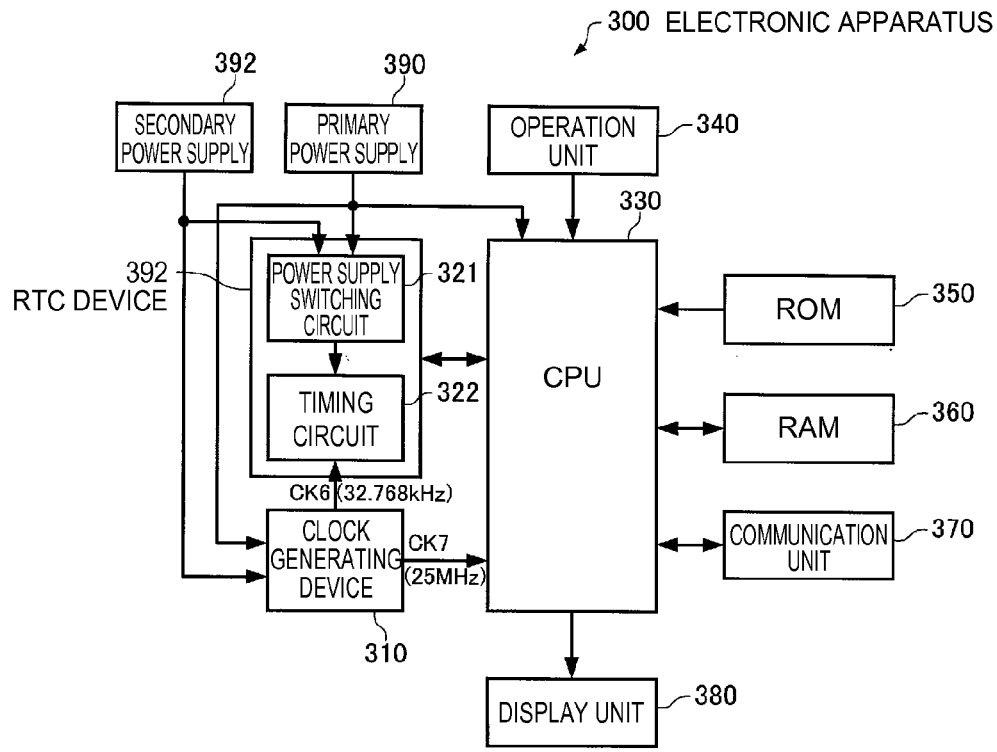
FIG. 14 is a block diagram illustrating functions of the electronic apparatuses according to the present embodiment.
Figure 15:
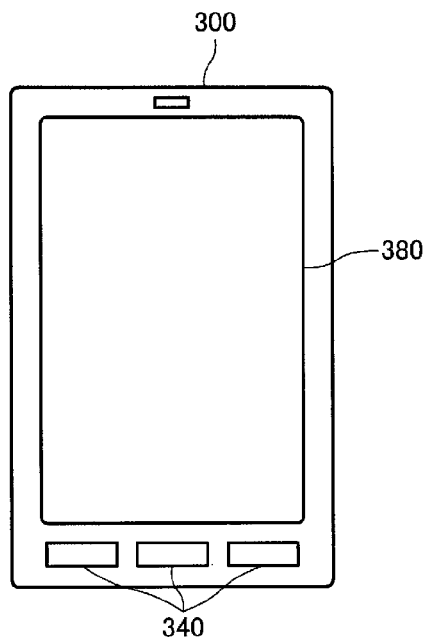
FIG. 15 is a diagram illustrating an exemplary external appearance of the electronic apparatus according to the present embodiment.

FIG. 14 is a block diagram illustrating functions of the electronic apparatuses according to the present embodiment. In addition, FIG. 15 is a diagram illustrating an exemplary external appearance of a mobile communication apparatus which is an example of the electronic apparatus according to the present embodiment.

An electronic apparatus 300 according to the present embodiment includes a clock generating device 310, a real time clock (RTC) device 320, a central processing unit (CPU) 330, an operation unit 340, a read only memory (ROM) 350, a random access memory (RAM) 360, a communication unit 370, a display unit 380, a primary power supply 390, and a secondary power supply 392. Further, the electronic apparatus according to the present embodiment may be configured by omitting or changing a portion of components (respective portions) of FIG. 14, or by adding other elements.

The primary power supply 390 is, for example, a power supply such as a lithium ion battery built into the electronic apparatus 300, or an AC power supply outside the electronic apparatus 300. The secondary power supply 392 is, for example, a power supply such as a coin battery built into the electronic apparatus 300.

The clock generating device 310 is, for example, the clock generating device 1 according to the present embodiment described above. As described above, when the power supply voltage of the primary power supply 390 is supplied, the clock signal CK6 (32.768 kHz) and the clock signal CK7 (25 MHz) are output together, and when the power supply voltage of the primary power supply 390 is not supplied, the clock signal CK6 (32.768 kHz) is output and the clock signal CK7 (25 MHz) is not output.

The real time clock device 320 includes a power supply switching circuit 321 and a timing circuit 322 to which the output voltage of the power supply switching circuit 321 is supplied as the power supply voltage, for example, one chip IC. The power supply switching circuit 321 supplies the power supply voltage of the primary power supply 390 to the timing circuit 322 when the power supply voltage of the primary power supply 390 is supplied, and substitutes the power supply voltage supplied to the timing circuit 322 to the power supply voltage of the secondary power supply 392 when the power supply voltage of the primary power supply 390 is not supplied. The timing circuit 322 performs a timing process in synchronization with the clock signal CK6 output by the clock generating device 310.

The CPU 330 operates by the primary power supply 390, and performs various kinds of computing processes and controlling processes according to programs stored in the ROM 350 or the like. Specifically, the CPU 330 synchronizes with the clock signal CK7 output by the clock generating device 310, and performs various processes corresponding to the operation signals from the operation unit 340, a process of controlling the communication unit 370 for performing data communication with an external device, a process of transmitting display signals for displaying various kinds of information on the display unit 380, and the like.

The operation unit 340 is an input device configured with operation keys, button switches, or the like, and outputs an operation signal corresponding to the operation by a user, to the CPU 330.

The ROM 350 stores programs or data for the CPU 330 to perform various kinds of calculation processes or control processes.

The RAM 360 is used as an operation area of the CPU 330, and temporarily stores programs or data read from the ROM 350, data input from the operation unit 340, results of the operations executed by the CPU 330 according to the various kinds of programs, or the like.

The communication unit 370 executes various kinds of controls for establishing the data communication between the CPU 330 and the external apparatus.

The display unit 380 is a display apparatus configured by a liquid crystal display (LCD) or the like, and displays various kinds of information based on display signals input from the CPU 330. A touch panel functioning as the operation unit 340 may be installed on the display unit 380.

It is possible to realize more credible electronic apparatus with less cost by combining the clock generating device 1 of the present embodiment as the clock generating device 310.

Various kinds of electronic apparatus may be considered as the electronic apparatus 300, and for example, a personal computer (for example, a mobile personal computer, a laptop computer, a notebook personal computer, and a tablet personal computer), a mobile terminal such as a portable telephone, a digital still camera, an ink jet-type discharging apparatus (for example, an ink jet printer), a storage area network apparatus such as a router or a switch, a local area network apparatus, a television, a video camera, a video tape recorder, a car navigation apparatus, a pager, an electronic organizer (including a communication function), an electronic dictionary, a calculator, an electronic game apparatus, a game controller, a word processor, a workstation, a video phone, a security television monitor, electronic binoculars, a POS terminal, medical equipment (for example, an electronic thermometer, a sphygmomanometer, a blood glucose monitoring system, an electrocardiographic apparatus, ultrasonic diagnostic equipment, and an electronic endoscope), a fish-finder, various kinds of measurement apparatus, meters (for example, instruments for vehicles, aircrafts, and vessels), a flight simulator, a head mounted display, motion trace, motion tracking, a motion controller, and pedestrian dead reckoning (PDR) may be included.

3. Moving Object

Figure 16:
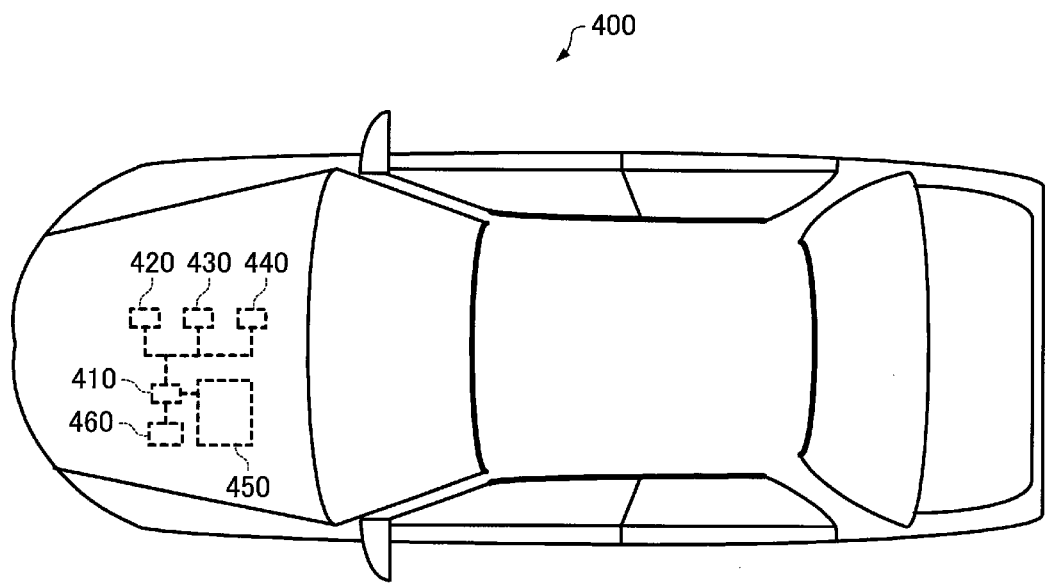
FIG. 16 is a diagram illustrating an example of a moving object according to the present embodiment.

FIG. 16 is a diagram (plan view) illustrating an example of a moving object according to the present embodiment. A moving object 400 illustrated in FIG. 16 includes a clock generating device 410, controllers 420, 430, and 440 that synchronize with various kinds of clock signals output by the clock generating device 410 and perform various kinds of controls of an engine system, a braking system, a keyless entry system, or the like, a battery 450, and a back-up battery 460. Further, the moving object according to the present embodiment may be configured by omitting or changing a portion of components (respective portions) of FIG. 16, or by adding other elements.

The clock generating device 1 according to the aforementioned embodiments can be applied as the clock generating device 410, and accordingly it is possible to secure high credibility.

Various kinds of moving objects can be considered as the moving object 400, and for example, vehicles (including electric vehicles), aircrafts such as jet planes and helicopters, vessels, rockets, and artificial satellites may be included.

4. Modification Example

The invention is not limited to the present embodiments, and various kinds of modifications are possible without departing from the gist of the invention.

For example, according to the present embodiment, the clock generating device 1 realized by one IC is described as an example, but the clock generating device 1 may be realized by a plurality of ICs, or may be realized by connecting a plurality of discrete parts respectively corresponding to a plurality of components of the clock generating device 1 by wire on a board.

In addition, for example, in the clock generating device 1 according to the present embodiment, the clock signal CK5 is selected as the clock signal CK6 when the power supply voltage VDD1 of the primary power supply is supplied, and the clock signal CK2 is selected and output to the outside as the clock signal CK6 when the power supply voltage VDD1 of the primary power supply is not supplied. However, the clock generating device 1 may always output the clock signal CK2 (corresponding to the second clock signal) generated by masking a portion of clocks of the clock signal CK1 (corresponding to the first clock signal) to the outside. In this case, the frequency converting unit 15 and the clock selecting unit 16 may not be provided.

In addition, for example, in the clock generating device 1 according to the present embodiment, the comparison unit 133 of the frequency measurement controlling unit 13 may compare the output value of the average value output unit 132 with n (n≥2) reference values R1, R2, R3, . . . , Rn (R1>R2>R3> . . . >Rn), and may select the value of T1 from n+1 values according to which of the ranges among n+1 ranges of a range greater than R2 equal to or less than R1, a range greater than R3 equal to or less than R2, . . . , a range less than Rn, the output value of an average value output unit 182 is included in. In this manner, since the measurement interval of the frequency ratio can be set more finely according to the movement average value of the number of masks K, it is possible to attain the power saving and to maintain the frequency precision.

In addition, for example, in the clock generating device 1 according to the present embodiment, the clock signal CK3 output by the crystal oscillator configured with the quartz resonator 2 and the oscillating circuit 30 is used as the clock signal that becomes a standard of the frequency ratio measurement. However, the output clock signals of various kinds of oscillators such as a temperature compensated crystal oscillator (Oven Controlled Xtal (Crystal) Oscillator (OCXO)), an atom oscillator, and a temperature compensation-type Micro Electro Mechanical Systems (MEMS) oscillator may be used.

In addition, for example, in the clock generating device 1 according to the present embodiment, the average value output unit 132 calculates a movement average value of N numbers of masks K every time one new number of masks K is stored in the FIFO memory 131. However, the movement average value of N numbers of masks K may be calculated every time m (2≤m≤N) numbers of masks K are newly stored in the FIFO memory 131.

The embodiments and the modification example described above are presented as examples, and the invention is not limited to this. For example, the embodiments and the modification example may be appropriately combined.

The invention includes configurations substantially the same as the configuration described in the embodiments (for example, configurations of which functions, methods, and results are the same, or configurations of which the objects and the effects are the same). In addition, the invention includes the configuration in which a portion of the configurations according to the embodiments which is not essential is substituted. In addition, the invention includes a configuration that has the same effect or that can achieve the same object as the configuration described in the embodiments. In addition, the configuration in which a known technique is added to a known related art is included.

The entire disclosure of Japanese Patent Application No. 2013-227072, filed Oct. 31, 2013 is expressly incorporated by reference herein.

What is claimed is:

1. A clock generating device is configured to:
measure a frequency ratio between a first clock signal and a reference frequency value based on a third clock signal;
generate a second clock signal obtained by masking a portion of clocks of the first clock signal based on a measurement result of the frequency ratio; and
control a measurement interval of the frequency ratio based on a difference between the measurement result of the frequency ratio and an average value of N (N is a natural number) measurement results of the frequency ratio.

2. The clock generating device according to claim 1, comprising:
a clock gate unit that generates the second clock signal;
a frequency measuring unit that measures the frequency ratio;
an oscillating circuit that outputs the third clock signal;
an average value output unit that outputs the average value;
a comparison unit that compares a measurement result of the frequency ratio and the average value, and outputs a value corresponding to the difference; and
a detection unit that compares the number of clocks of the second clock signal and an output value of the comparison unit and controls a measurement interval of the frequency ratio based on a comparison result.

3. The clock generating device according to claim 2, wherein the comparison unit outputs a greater value when the difference is within a reference value than when the difference is greater than a reference value.

4. The clock generating device according to claim 1, wherein the average value is a movement average value of N measurement results of the frequency ratios.

5. An electronic apparatus comprising:
a clock generating device that is configured to:
measure a frequency ratio between a first clock signal and a reference frequency value based on a third clock signal;
generate a second clock signal obtained by masking a portion of clocks of the first clock signal based on a measurement result of the frequency ratio; and
control a measurement interval of the frequency ratio based on a difference between the measurement result of the frequency ratio and an average value of N (N is a natural number) measurement results of the frequency ratio; and
a real time clock device that synchronizes with the second clock signal output by the clock generating device, and generates time information.

6. The electronic apparatus according to claim 5, wherein the clock generating devise comprises:
a clock gate unit that generates the second clock signal;
a frequency measuring unit that measures the frequency ratio;
an oscillating circuit that outputs the third clock signal;
an average value output unit that outputs the average value;
a comparison unit that compares a measurement result of the frequency ratio and the average value, and outputs a value corresponding to the difference; and
a detection unit that compares the number of clocks of the second clock signal and an output value of the comparison unit and controls a measurement interval of the frequency ratio based on a comparison result.

7. The electronic apparatus according to claim 6, wherein the comparison unit outputs a greater value when the difference is within a reference value than when the difference is greater than a reference value.

8. The electronic apparatus according to claim 5, wherein the average value is a movement average value of N measurement results of the frequency ratios.

9. A clock generating method comprising:
measuring a frequency ratio between a first clock signal and a reference frequency value based on a third clock signal;
generating a second clock signal obtained by masking a portion of clocks of the first clock signal based on a measurement result of the frequency ratio; and
controlling a measurement interval of the frequency ratio based on a difference between the measurement result of the frequency ratio and an average value of N (N is a natural number) measurement results of the frequency ratio.

* * * * *